(12) United States Patent
Sawashi et al.

(10) Patent No.: US 12,185,463 B2
(45) Date of Patent: Dec. 31, 2024

(54) WIRING CIRCUIT BOARD AND METHOD OF PRODUCING THE SAME

(71) Applicant: NITTO DENKO CORPORATION, Osaka (JP)

(72) Inventors: Kanayo Sawashi, Osaka (JP); Akihito Matsutomi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 220 days.

(21) Appl. No.: 18/056,095

(22) Filed: Nov. 16, 2022

(65) Prior Publication Data
US 2023/0189440 A1    Jun. 15, 2023

(30) Foreign Application Priority Data
Nov. 25, 2021    (JP) ................................. 2021-191227

(51) Int. Cl.
| | |
|---|---|
| *H05K 1/11* | (2006.01) |
| *H05K 3/40* | (2006.01) |
| *H05K 3/46* | (2006.01) |

(52) U.S. Cl.
CPC ........... *H05K 1/115* (2013.01); *H05K 3/4084* (2013.01); *H05K 3/4623* (2013.01);
(Continued)

(58) Field of Classification Search
CPC .... H05K 1/115; H05K 3/4084; H05K 3/4623; H05K 2201/09509; H05K 2201/09827; H05K 2203/107
(Continued)

(56) References Cited

U.S. PATENT DOCUMENTS

| | | | |
|---|---|---|---|
| 2008/0230258 A1* | 9/2008 | Shen ......................... | G06F 1/16 174/251 |
| 2009/0295685 A1* | 12/2009 | Yum ....................... | H05K 3/426 428/138 |

(Continued)

FOREIGN PATENT DOCUMENTS

| | | |
|---|---|---|
| JP | 2018-021171 A | 2/2018 |
| JP | 2019-123851 A | 7/2019 |

(Continued)

*Primary Examiner* — Timothy J Thompson
*Assistant Examiner* — Michael F McAllister
(74) *Attorney, Agent, or Firm* — Edwards Neils LLC; Jean C. Edwards, Esq.

(57) ABSTRACT

A wiring circuit board includes an insulating layer having a via penetrating in a thickness direction, a first conductive layer disposed on a one-side surface in the thickness direction of the insulating layer, a second conductive layer disposed on the other-side surface in the thickness direction of the insulating layer, and a conductive portion disposed on an inner peripheral surface of the via and electrically connecting the first and second conductive layers. Length L of 1 μm-10 μm inclusive, is measured by: drawing a segment joining first and second connection points from respectively, the one-side surface to the other-side surface in the thickness direction of the insulating layer and the inner peripheral surface in the cross-sectional view; identifying an outermost position farthest outward from the segment on the inner peripheral surface in the cross-sectional view; and measuring the length as the shortest distance from the segment to the outermost position.

6 Claims, 7 Drawing Sheets

(52) U.S. Cl.
CPC .............. *H05K 2201/09509* (2013.01); *H05K 2201/09827* (2013.01); *H05K 2203/107* (2013.01)

(58) Field of Classification Search
USPC ........................................................ 174/261
See application file for complete search history.

(56) References Cited

U.S. PATENT DOCUMENTS

| | | |
|---|---|---|
| 2019/0263996 A1 | 8/2019 | Nakamura et al. |
| 2020/0032026 A1 | 1/2020 | Nakamura et al. |

FOREIGN PATENT DOCUMENTS

| | | |
|---|---|---|
| JP | 2020-049905 A | 4/2020 |
| JP | 2021-016006 A | 2/2021 |

* cited by examiner

WIRING CIRCUIT BOARD AND METHOD OF PRODUCING THE SAME

CROSS-REFERENCE TO RELATED APPLICATION

The present application claims priority from Japanese Patent Application No. 2021-191227 filed on Nov. 25, 2021, the contents of which are hereby incorporated by reference into this application.

BACKGROUND ART

The present invention relates to a wiring circuit board and a method of producing the wiring circuit board.

Wiring circuit boards each including a first conductive layer, an insulating layer, and a second conductive layer in this order in the thickness direction are known (for example, see Patent document 1 below). In the wiring circuit board of Patent document 1 cited below, the insulating layer includes a blind via. The wiring circuit board further includes a conductive portion. The conductive portion is disposed on the inner peripheral surface of the insulating layer facing the blind via. In the wiring circuit board, the conductive portion electrically connects the first conductive layer and the second conductive layer.

CITATION LIST

Patent Document

Patent Document 1: Japanese Unexamined Patent Publication No. 2019-123851

SUMMARY OF THE INVENTION

Problem to be Solved by the Invention

High adhesion of the conductive portion to the inner peripheral surface is required in the wiring circuit board. Further, high connection reliability of the conductive portion is required in the wiring circuit board.

However, the wiring circuit board of Patent Document 1 may not satisfy the above-described requirements.

The present invention provides a wiring circuit board including a conductive portion with high adhesion and high connection reliability and a method of producing the wiring circuit board.

Means for Solving the Problem

The present invention [1] includes a wiring circuit board comprising: an insulating layer having a via penetrating in a thickness direction; a first conductive layer disposed on a one-side surface in the thickness direction of the insulating layer; a second conductive layer disposed on the other-side surface in the thickness direction of the insulating layer; and a conductive portion disposed on an inner peripheral surface of the via and electrically connecting the first conductive layer and the second conductive layer, wherein a length L that is measured as follows is 1 μm or more and 10 μm or less.

The length L: Draw a segment S joining a first connection point C1 at which the one-side surface in the thickness direction of the insulating layer and the inner peripheral surface are connected and a second connection point C2 at which the other-side surface in the thickness direction of the insulating layer and the inner peripheral surface are connected in a cross-sectional view. Identify an outermost position P that is farthest outward from the segment S on the inner peripheral surface in the cross-sectional view. Measure the length L as the shortest distance from the segment S to the outermost position P.

In the wiring circuit board, the length L is 1 μm or more. Thus, based on the high anchor effect of the conductive portion with respect to the inner peripheral surface, the conductive portion has excellent adhesion to the inner peripheral surface.

In the wiring circuit board, the length L is 10 μm or less. Thus, inadequate formation of the conductive portion is suppressed. Consequently, the conductive portion has excellent connection reliability to the first conductive layer and the second conductive layer.

The present invention [2] includes the wiring circuit board in [1], wherein the insulating layer includes a porous insulating layer.

In the wiring circuit board, the insulating layer includes the porous insulating layer, and thus the length L can surely be 1 μm or more.

The present invention [3] includes the wiring circuit board described in [1] or [2], wherein the inner peripheral surface has a tapered shape when a cross section of the inner peripheral surface is macroscopically viewed.

In the wiring circuit board, the inner peripheral surface has a tapered shape when the cross section of the inner peripheral surface is macroscopically viewed. Thus, the inadequate formation of the conductive portion can more be suppressed.

The present invention [4] includes a method of producing a wiring circuit board, the method being a method of producing the wiring circuit board described in any one of [1] to [3], the method including: a step of preparing a laminate including a second conductive layer, an insulating layer, and an underlying conductive layer; a step of irradiating the laminate with a laser from one side in the thickness direction to form a via in the underlying conductive layer and the insulating layer; and a step of forming an additional conductive layer on the one-side surface of the laminate and forming a conductive portion on an inner peripheral surface of the via, wherein the step of forming the via includes a step of applying the laser with an energy density of 1 J/cm$^2$ or more and 20 J/cm$^2$ or less.

By the production method, the step of forming the via includes a step of applying the laser with an energy density of 1 J/cm$^2$ or more and 20 J/cm$^2$ or less. Thus, the manufacturing efficiency is improved and the length L on the inner peripheral surface is adjusted to 10 μm or less.

The present invention [5] includes the method described in [4], wherein, in the step of forming the via, the laser rotates while moving from inside outward in a region in which the via is formed.

By the method, the laser rotates while moving from the inside outward. This facilitates the formation of the tapered shape of the inner peripheral surface.

The present invention [6] includes the method described in [4] or [5], wherein, in the step of preparing the laminate, the insulating layer includes an adhesive insulating layer and a porous insulating layer in this order in the thickness direction.

Effects of the Invention

The wiring circuit board and method of producing the wiring circuit board of the present invention include a conductive portion having high adhesion and high connection reliability.

BRIEF DESCRIPTION OF THE DRAWINGS

FIG. 2A and FIG. 2B are plan views of the wiring circuit board of FIG. 1. FIG. 2A illustrates a state in which a laser rotates while moving from the inside toward the outside of the region in which a via is formed. FIG. 2B illustrates a state in which a laser rotates while moving from the outside toward the inside of the region in which a via is formed.

FIGS. 4A to 4C illustrate the steps of producing the wiring circuit board of FIG. 1. FIG. 4A illustrates a step of preparing a laminate. FIG. 4B illustrates a step of forming a via. FIG. 4C illustrates a step of forming an additional conductive layer and a conductive portion.

DESCRIPTION OF THE EMBODIMENT

1. Wiring Circuit Board 1

Figure 1:
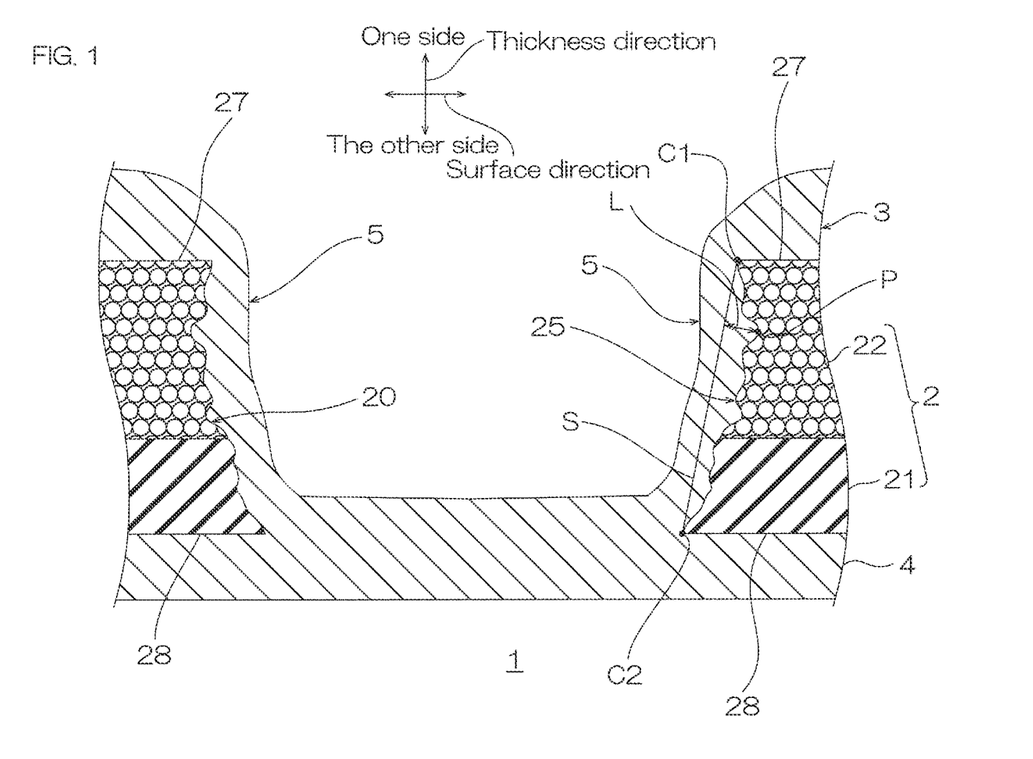
FIG. 1 is a cross-sectional view of one embodiment of the wiring circuit board of the present invention.

One embodiment of the wiring circuit board of the present invention is described with reference to FIG. 1 to FIG. 4C. As illustrated in FIG. 1, a wiring circuit board 1 has a sheet shape. The wiring circuit board 1 has a thickness.

The wiring circuit board 1 extends in a surface direction. The surface direction is orthogonal to the thickness direction. The wiring circuit board 1 includes an insulating layer 2, a first conductive layer 3, a second conductive layer 4, and a conductive portion 5.

1.2 Insulating Layer 2

The insulating layer 2 has a sheet shape. The insulating layer 2 extends in the surface direction. The insulating layer 2 has an outer shape identical to the wiring circuit board 1 in a plan view. The insulating layer 2 includes a one-side surface 27 and the other-side surface 28 which face each other in the thickness direction. Each of the one-side surface 27 and the other-side surface 28 is flat. The other-side surface 28 is parallel to the one-side surface 27.

Examples of the material of the insulating layer 2 include resins. Examples of the resins include, for example, polyimide resin, fluorine resin, and liquid crystal polymer. The resins include adhesives. Examples of the adhesives include, for example, acrylic adhesives, epoxy adhesives, and silicone adhesives. These can be used singly or in combination. The insulating layer 2 has a thickness of, for example, 2 μm or more, preferably 5 μm or more, and, for example, 1,000 μm or less, preferably 500 μm or less.

The insulating layer 2 includes an adhesive insulating layer 21 and a porous insulating layer 22 in this order toward one side in the thickness direction. In the present embodiment, the insulating layer 2 preferably includes only the adhesive insulating layer 21 and the porous insulating layer 22.

1.2.1 Adhesive Insulating Layer 21

The adhesive insulating layer 21 is the other-side part of the insulating layer 2 in the thickness direction. The adhesive insulating layer 21 forms the other-side surface 28 of the insulating layer 2. The adhesive insulating layer 21 is dense and is not porous. The adhesive insulating layer 21 bonds the porous insulating layer 22 to the second conductive layer 4. Examples of the material of the adhesive insulating layer 21 include the above-described adhesives. The adhesive insulating layer 21 has a thickness of, for example, 2 μm or more, preferably 5 μm or more, and, for example, 50 μm or less, preferably 25 μm or less. The percentage of the thickness of the adhesive insulating layer 21 in the thickness of the insulating layer 2 is for example, 1% or more, preferably 3% or more, and, for example, 70% or less, preferably 50% or less. The material and properties of the adhesive insulating layer 21 are described in Japanese Unexamined Patent Publication No. 2020-049905.

1.2.2 Porous Insulating Layer 22

The porous insulating layer 22 is a one-side part of the insulating layer 2 in the thickness direction. The porous insulating layer 22 forms the one-side surface 27 of the insulating layer 2. The porous insulating layer 22 is disposed on a one-side surface of the adhesive insulating layer 21 in the thickness direction. In detail, the porous insulating layer 22 is in contact with the whole of the one-side surface of the adhesive insulating layer 21 in the thickness direction. The porous insulating layer 22 has a lot of fine holes (pores). The porous insulating layer 22 has a thickness of, for example, 2 μm or more, preferably 5 μm or more, and, for example, 1,000 μm or less, preferably 500 μm or less.

The ratio of the thickness of the porous insulating layer 22 in the thickness of the insulating layer 2 is, for example, 20% or more, preferably, 50% or more, and, for example, 95% or less, preferably 90% or less. The ratio of the thickness of the porous insulating layer 22 to the thickness of the adhesive insulating layer 21 is, for example, 0.5 or more, preferably 1 or more, and, for example, 50 or less, preferably 20 or less. Examples of the material of the porous insulating layer 22 include the above-described resins. The average pore size of the porous insulating layer 22 is, for example, 10 μm or less, and, for example, 0.1 μm or more. The porous insulating layer 22 has a porosity of, for example, 60% or more, preferably 70% or more, and, for example, 99% or less, preferably 90% or less. The material and properties of the porous insulating layer 22 are described in Japanese Unexamined Patent Publication No. 2018-021171 and Japanese Unexamined Patent Publication No. 2020-049905.

The insulating layer 2 including the above-described adhesive insulating layer 21 and porous insulating layer 22 is described in Japanese Unexamined Patent Publication No. 2020-049905.

1.2.3 Via 20

The insulating layer 2 further includes a via 20. A single via 20 or a plurality of vias 20 is included in the insulating layer 2. The via 20 penetrates the insulating layer 2 in the thickness direction. Further, the via 20 penetrates the first conductive layer 3. On the other hand, the via 20 does not penetrate the second conductive layer 4. The via 20 can visually be observed from one side in the thickness direction and cannot visually be observed from the other side. Thus, the via 20 is referred to as a blind via. As illustrated with the dotted lines in FIGS. 2A and 2B, in the present embodiment, the via 20 has an approximately circular shape when being viewed from the one side in thickness direction. As illustrated in FIG. 1, the insulating layer 2 has an inner peripheral surface 25 facing the via 20. The inner peripheral surface 25 is described below.

1.3 First Conductive Layer 3

The first conductive layer 3 is disposed on the one-side surface in the thickness direction of the insulating layer 2. The first conductive layer 3 is in contact with the whole of the one-side surface in the thickness direction of the insulating layer 2. Examples of the material of the first conductive layer 3 include, for example, metals, and copper is preferable. The first conductive layer 3 has a thickness of, for example, 0.1 μm or more, preferably 1 μm or more, and, for example, 100 μm or less, preferably 50 μm or less. The first conductive layer 3 is described in Japanese Unexamined Patent Publication No. 2020-049905.

1.4 Second Conductive Layer 4

The second conductive layer 4 is disposed on the other-side surface in the thickness direction of the insulating layer 2. The second conductive layer 4 is in contact with the whole of the other-side surface in the thickness direction of the insulating layer 2. Further, the second conductive layer 4 covers a lower end of the via 20 of the insulating layer 2. The material of the second conductive layer 4 is, for example, the same as the material of the first conductive layer 3. Specifically, copper is used. The second conductive layer 4 has a thickness of, for example, 0.1 μm or more, preferably 1 μm or more, and, for example, 100 μm or less, preferably 50 μm or less. The second conductive layer 4 is described in Japanese Unexamined Patent Publication No. 2020-049905.

1.5 Conductive Portion 5

The conductive portion 5 is disposed at an inside of the via 20. In detail, the conductive portion 5 is disposed on the inner peripheral surface 25 of the insulating layer 2 facing the via 20. The conductive portion 5 is continuous to a part of the first conductive layer 3 facing one end in the thickness direction of the via 20 and to a peripheral end of a part of the second conductive layer 4 covering the via 20. In other words, the conductive portion 5 is continuous to the first conductive layer 3 and the second conductive layer 4. In this manner, the conductive portion 5 electrically connects the first conductive layer 3 and the second conductive layer 4. The conductive portion 5 has a film shape in conformity with the inner peripheral surface 25. The material of the conductive portion 5 is, for example, the same as the material of the first conductive layer 3, and specifically copper is used.

1.6 Inner Peripheral Surface 25

The inner peripheral surface 25 has, for example, fine asperities. The asperities are formed, for example, depending on the above-described properties of the insulating layer 2 (for example, fine holes of the porous insulating layer 22) and the method of producing the wiring circuit board 1. A length L on the inner peripheral surface 25 that is measured as follows is 1 μm or more and 10 μm or less.

Length L: Draw a segment S joining a first connection point C1 at which the one-side surface 27 in the thickness direction of the insulating layer 2 and the inner peripheral surface 25 are connected and a second connection point C2 at which the other-side surface 28 in the thickness direction of the insulating layer 2 and the inner peripheral surface 25 are connected in the cross-sectional view. Identify an outermost position P that is farthest outward from the segment S on the inner peripheral surface 25 in the cross-sectional view. Measure the length L as the shortest distance from the segment S to the outermost position P.

When the length L is less than 1 μm, the anchor effect of the conductive portion 5 with respect to the inner peripheral surface 25 is low. Thus, the adhesion of the conductive portion 5 to the inner peripheral surface 25 decreases.

When the length L exceeds 10 μm, the inadequate formation of the conductive portion 5 easily occurs in the production method described below, and thus the connection reliability of the conductive portion 5 to the first conductive layer 3 and the second conductive layer 4 decreases.

The length L is preferably 2 μm or more, more preferably 4 μm or more, even more preferably 5 μm or more. When the length L is the above-described lower limit or more, the anchor effect of the conductive portion 5 with respect to the inner peripheral surface 25 is increased. The increase in the anchor effect can more improve the adhesion of the conductive portion 5 to the inner peripheral surface 25.

The length L is preferably 9 μm or less, more preferably 8 μm or less, even more preferably 7 μm or less. When the length L is the above-described upper limit or less, the inadequate formation of the conductive portion 5 can more be suppressed in the production method. The connection reliability of the conductive portion 5 to the first conductive layer 3 and the second conductive layer 4 can more be improved.

The length L is adjusted depending on the average pore size and porosity of the porous insulating layer 22 and/or the conditions for the irradiation of a laser (described below).

In the present embodiment, the outermost position P preferably exists on the porous insulating layer 22.

Figure 7:
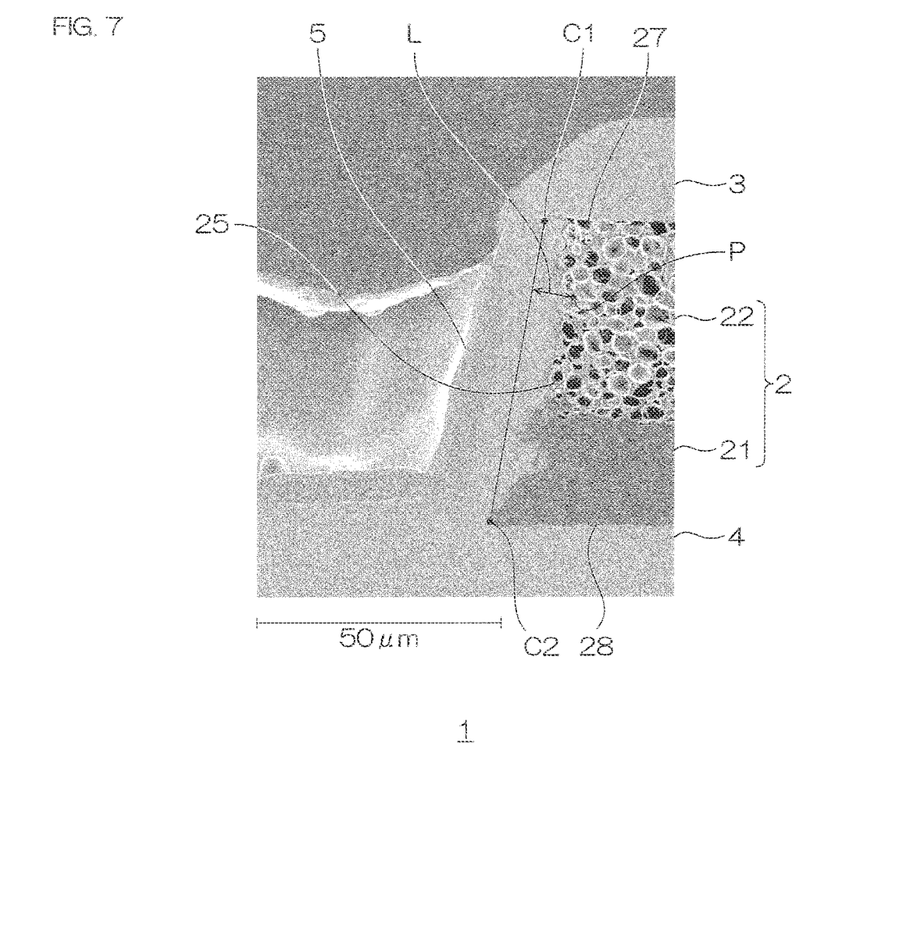
FIG. 7 is a view of a processed image of an SEM picture of the inner peripheral surface of Example 1.

The cross-section is viewed, for example, by the observation of a processed image of an SEM picture as illustrated in FIG. 7.

Figure 3:
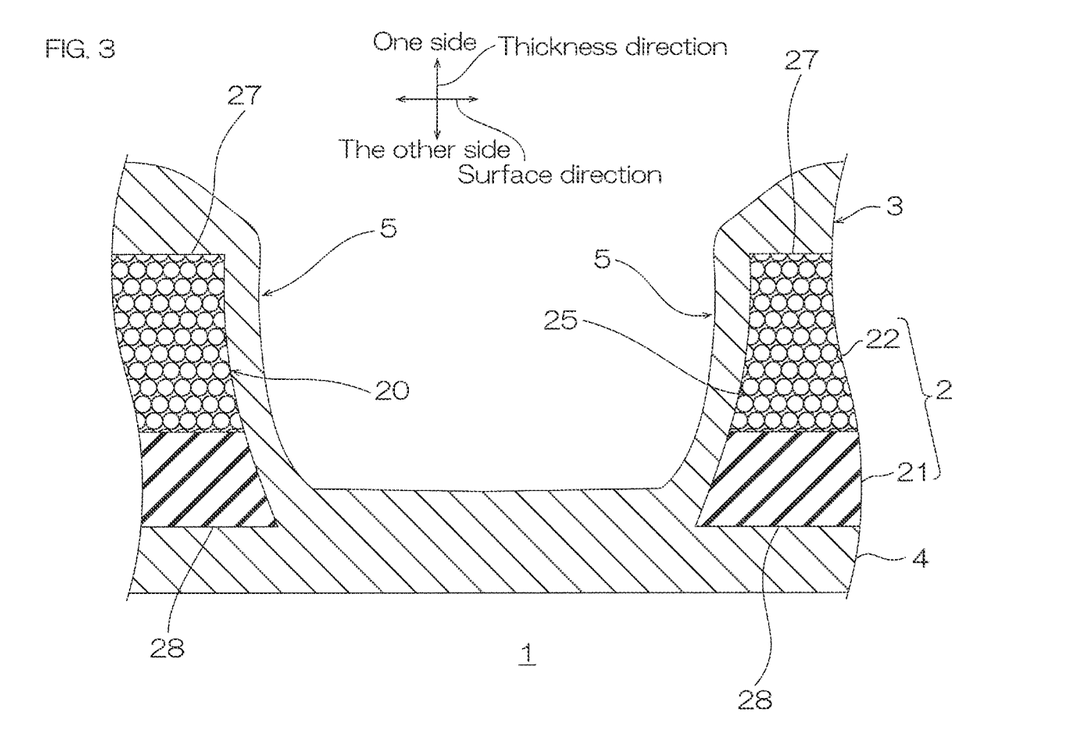
FIG. 3 is a macroscopic cross-sectional view of the inner peripheral surface.

As illustrated in FIG. 3, the inner peripheral surface 25 has a tapered shape when the cross section is macroscopically viewed. The expression "is macroscopically viewed" means that the above-described asperities are leveled and the shape of the inner peripheral surface 25 is roughly captured. The area of the opening of the above-described tapered shape gradually increases toward the one side in the thickness direction when the cross section is macroscopically viewed.

1.7 Method of Producing Wiring Circuit Board 1

Next, the method of producing the wiring circuit board 1 is described. The method of producing the wiring circuit board 1 includes a step of preparing a laminate 6, a step of forming the via 20, and a step of forming the conductive portion 5 in this order.

1.7.1 Step of Preparing Laminate 6

Figure 4A:
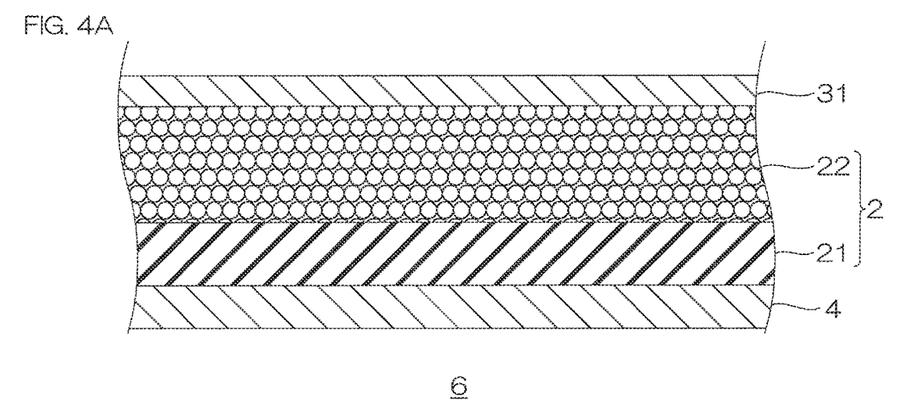

As illustrated in FIG. 4A, the laminate 6 includes the second conductive layer 4, the insulating layer 2, and an underlying conductive layer 31 in this order toward the one side in the thickness direction. The insulating layer 2 of the laminate 6 does not have the via 20 (see FIG. 1) yet. The underlying conductive layer 31 is disposed on the one-side surface in the thickness direction of the insulating layer 2. The underlying conductive layer 31 corresponds to the other-side part in the thickness direction of the first conductive layer 3. In the present embodiment, the underlying conductive layer 31 is a base for forming an additional conductive layer 32 (described below, see FIG. 4C) by plating. The laminate 6 and the method of preparing thereof are described in Japanese Unexamined Patent Publication No. 2020-049905.

1.7.2 Step of Forming Via 20

Figure 4B:
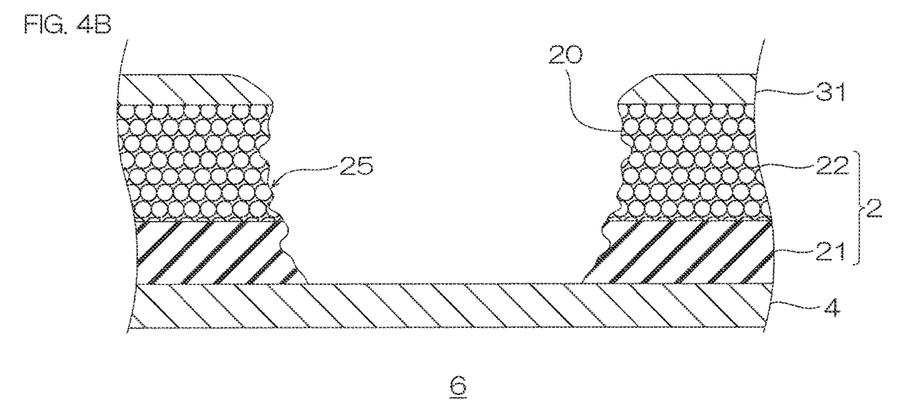

As illustrated in FIG. 4B, next, the laminate 6 is irradiated with a laser from the one side in the thickness direction, thereby forming the via 20 in the underlying conductive layer 31 and the insulating layer 2.

Examples of the laser include YAG lasers and carbon dioxide lasers. The laser irradiation includes a single step or a plurality of steps. Preferably, in view of the high manufacturing efficiency and the formation of a good shape of the via 20, two steps are carried out. In other words, the step of forming the via 20 includes a first irradiation step and a second irradiation step in this order. In both of the first irradiation step and the second irradiation step, the laminate 6 is irradiated with a laser.

The energy density in the first irradiation step is, for example, 1 J/cm$^2$ or more, preferably 10 J/cm$^2$ or more, and, for example, 20 J/cm$^2$ or less, preferably 18 J/cm$^2$ or less. When the energy density in the first irradiation step is the above-described lower limit or more, the manufacturing efficiency is improved. When the energy density in the first irradiation step is the above-described upper limit or less, the length L can be adjusted to the above-described upper limit or less, and the via 20 can be formed into a tapered shape.

The energy density in the second irradiation step is, for example, lower than the energy density in the first irradiation step. Making the energy density in the second irradiation step lower than the energy density in the first irradiation step allows the insulating layer 2 to be removed while the underlying conductive layer 31 is left.

Specifically, the ratio of the energy density in the second irradiation step to the energy density in the first irradiation step is, for example, 0.01 or more, preferably 0.02 or more, and, for example, 0.4 or less, preferably 0.1 or less. Specifically, the energy density in the second irradiation step is, for example, 0.01 J/cm$^2$ or more, and, for example, 0.1 J/cm$^2$ or less.

Figure 2A:
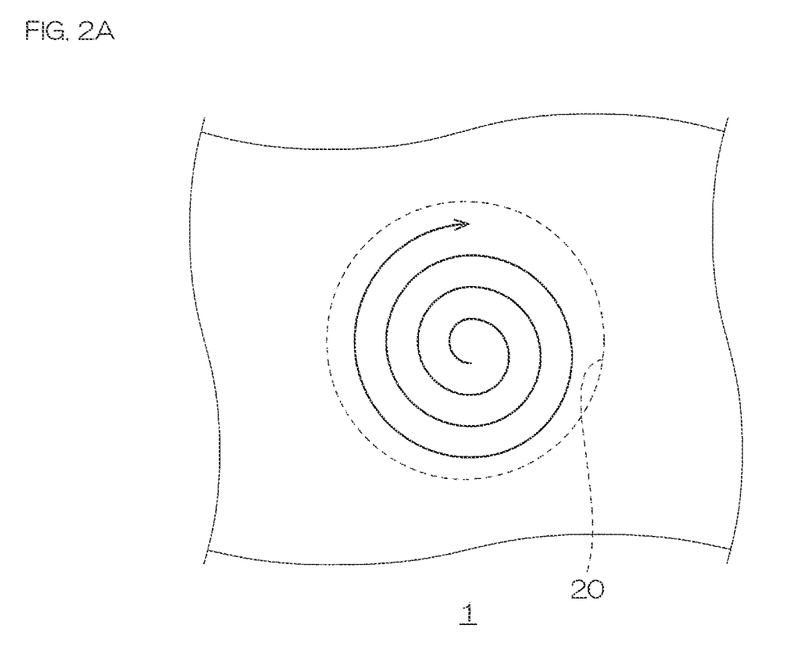
Figure 2B:
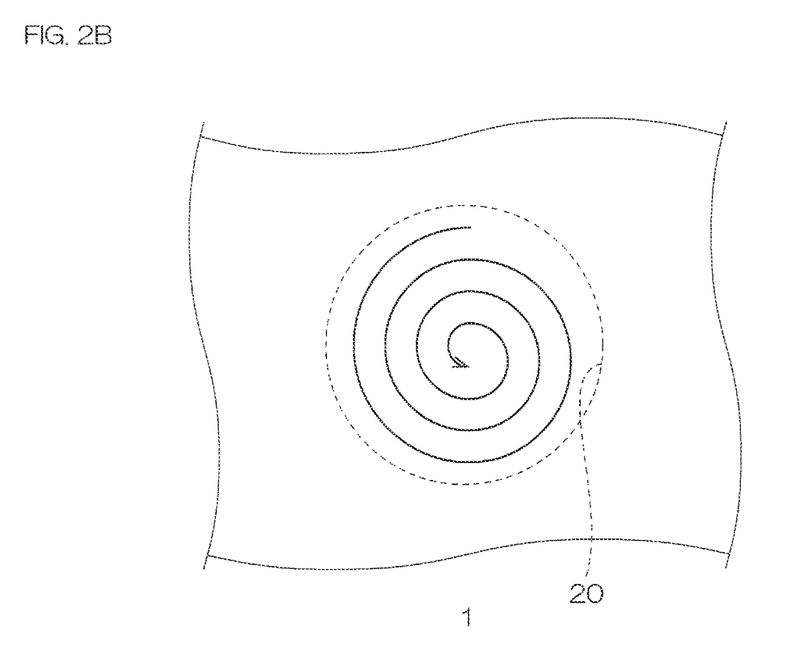

In the step of forming the via 20, an irradiation method in which a laser rotates while moving from the inside outward in the region in which the via 20 is formed as illustrated with the arrow of FIG. 2A when the laser is viewed in the thickness direction and an irradiation method in which a laser rotates while moving from the outside inward in the region in which the via 20 is formed as illustrated with the arrow of FIG. 2B when the laser is viewed in the thickness direction are used. The rotation is carried out more than once. Preferably, when being viewed in the thickness direction, the laser rotates while moving from the inside outward in the region in which the via 20 as illustrated with the arrow of FIG. 2A. By this irradiation method, the spot where the laser irradiation is carried out with the maximum energy remains on the wall surface of the via 20 during a large part of the first half of the irradiation time. This allows the formation of the tapered shape of the inner peripheral surface 25 when the cross section is macroscopically viewed. On the other hand, when the laser rotates while moving from the outside toward the inside as illustrated with the arrow of FIG. 2B, the laser leakage occurs when the laser irradiation is carried out in an area inside the area where the inner peripheral surface 25 is formed in the via 20 and the leakage affects the above-described spot. This may form the inner peripheral surface 25 into a shape in which the intermediate part in the thickness direction of the inner peripheral surface 25 extends outward as described in the first variation below.

By this step, as illustrated in FIG. 4B, the via 20 is formed in the underlying conductive layer 31 and the insulating layer 2. On the other hand, the via 20 is not formed in the second conductive layer 4.

1.7.3 Step of Forming the Conductive Portion 5

Figure 4C:
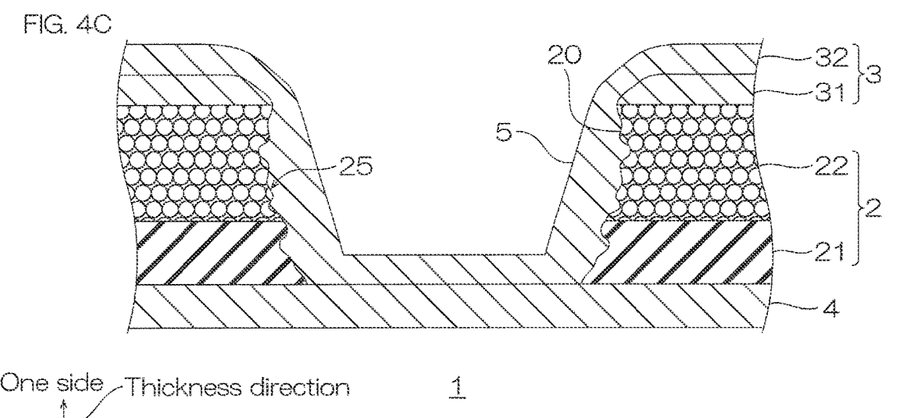

Next, as illustrated in FIG. 4C, the additional conductive layer 32 is formed on a one-side surface in the thickness direction of the laminate 6, and the conductive portion 5 is formed on the inner peripheral surface 25 of the via 20.

The additional conductive layer 32 corresponds to a one-side part in the thickness direction of the first conductive layer 3. The additional conductive layer 32 is added to the underlying conductive layer 31, thereby forming the first conductive layer 3. In this step, for example, plating or sputtering is carried out. Preferably, plating is carried out. By this step, the additional conductive layer 32 and the conductive portion 5 are simultaneously formed. The additional conductive layer 32 is added also to a part of the second conductive layer 4 that covers the lower end of the via 20. When the additional conductive layer 32 is made of the same material as the underlying conductive layer 31, the boundary between the additional conductive layer 32 and the underlying conductive layer 31 is unclear.

The conductive portion 5 enters the asperities of the inner peripheral surface 25 and the conductive portion 5 exhibits the anchor effect with respect to the inner peripheral surface 25.

2. Operations and Effects of One Embodiment

In the wiring circuit board 1, the length L is 1 μm or more. Thus, based on the high anchor effect of the conductive portion 5 with respect to the inner peripheral surface 25, the conductive portion 5 has the excellent adhesion to the inner peripheral surface 25.

In the wiring circuit board 1, the length L is 10 μm or less, and thus the inadequate formation of the conductive portion 5 is suppressed. Hence, the excellent connection reliability of the conductive portion 5 to the first conductive layer 3 and the second conductive layer 4 is achieved. The inadequate formation of the conductive portion 5 includes a crack and/or a void. In the wiring circuit board 1, the insulating layer 2 includes the porous insulating layer 22, and thus the length L can surely be 1 μm or more.

As illustrated in FIG. 3, in the wiring circuit board 1, the inner peripheral surface 25 has a tapered shape when the cross section is macroscopically viewed, and thus the inadequate formation of the conductive portion 5 is more suppressed.

In this production method, the step of forming the via 20 includes the first irradiation step in which the laser irradiation is carried out with a laser energy density of 1 J/cm$^2$ or more and 20 J/cm$^2$ or less, and thus the manufacturing efficiency is improved while the length L on the inner peripheral surface 25 can be adjusted to 10 μm or less.

3. Variations

In each of the variations, the same members and steps as in one embodiment are given the same reference numerals and the detailed descriptions thereof are omitted. Further, the variations can have the same operations and effects as those of one embodiment unless especially described otherwise. Furthermore, the embodiment and variations can appropriately 5 be combined.

3.1 First Variation

Figure 5:
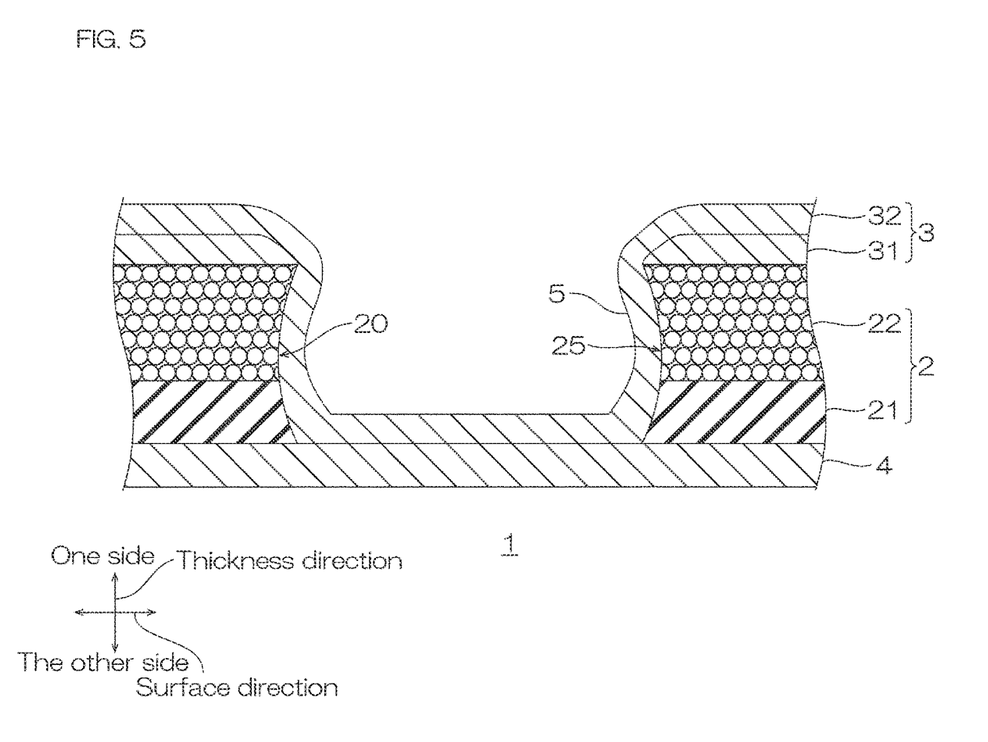
FIG. 5 is a cross-sectional view of the first variation.

As illustrated in FIG. 5, the intermediate portion in the thickness direction of the inner peripheral surface 25 extends outward when the cross section is macroscopically viewed. Thus, the via 20 has an approximately vase shape in the cross-sectional view.

In comparison of one embodiment and the first variation, one embodiment is preferable. As illustrated in FIG. 3, in one embodiment, the inner peripheral surface 25 has a tapered shape when the cross section is macroscopically viewed. Thus, for example, the conductive portion 5 is stably formed as an even film by plating.

3.2 Second Variation

Figure 6:
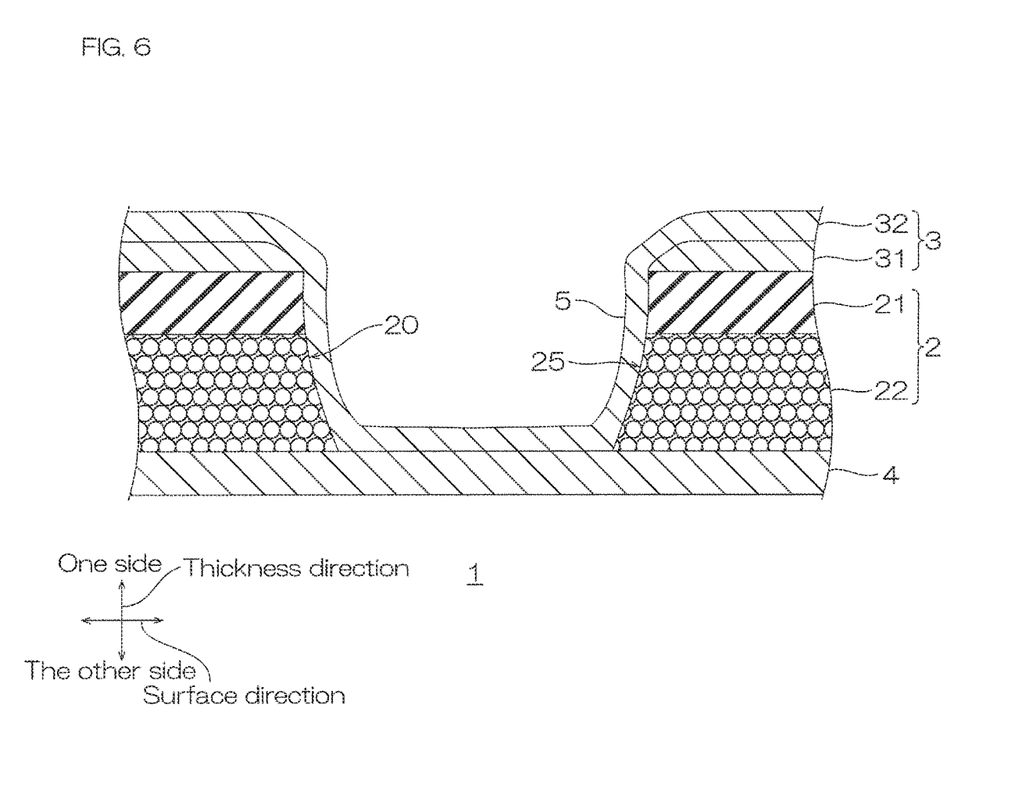
FIG. 6 is a cross-sectional view of the second variation.

As illustrated in FIG. 6, the insulating layer 2 includes the porous insulating layer 22 and the adhesive insulating layer 21 in this order toward the one side in the thickness direction.

3.3 Third Variation

Although not illustrated, the insulating layer 2 includes only the porous insulating layer 22.

3.4 Fourth Variation

Although not illustrated, the insulating layer 2 includes the adhesive insulating layer 21 (see FIG. 1), the porous insulating layer 22, and the adhesive insulating layer 21 (see FIG. 6) in this order toward the one side in the thickness direction.

3.5 Fifth Variation

A skin layer not illustrated may be provided on one or both of the one-side surface and the other-side surface of the porous insulating layer 22. The skin layer is flat and smooth. The skin layer is a non-porous layer.

When the skin layer is provided only on the other-side surface of the porous insulating layer 22, the insulating layer 2 includes the adhesive insulating layer 21, the skin layer not illustrated, and the porous insulating layer 22 in this order toward the one side in the thickness direction.

EXAMPLES

Next, the present invention is more specifically described with reference to Examples and Comparative Examples. The present invention is not limited to the following Examples and Comparative Examples in any way. The specific numeral values used in the description below, such as blending ratios (content ratios), physical property values, and parameters, can be replaced with the corresponding blending ratios (content ratios), physical property values, and parameters in the above-described "DESCRIPTION OF THE EMBODIMENT", including the upper limit values (numeral values defined with "or less", and "less than") or the lower limit values (numeral values defined with "or more", and "more than").

Example 1

As illustrated in FIG. 4A, the laminate 6 was prepared according to the description in Japanese Unexamined Patent Publication No. 2020-049905. The laminate 6 included the second conductive layer 4, the insulating layer 2, and the underlying conductive layer 31. The second conductive layer 4 had a thickness of 18 μm and consisted of copper. The insulating layer 2 included the adhesive insulating layer 21 having a thickness of 20 μm and the porous insulating layer 22 having a thickness of 45 μm. The porous insulating layer 22 consisted of polyimide resin and had an average pore size of 4.5 μm and a porosity of 75%. The underlying conductive layer 31 had a thickness of 18 μm and consisted of copper.

As illustrated in FIG. 4B, the laminate 6 was irradiated with a YAG laser from one side in the thickness direction, thereby forming the via 20 in the underlying conductive layer 31 and the insulating layer 2. A plurality of vias 20 was formed. The laser used in the first irradiation step had an energy density of 17.2 J/cm$^2$ or more. The laser used in the second irradiation step had an energy density of 0.05 J/cm$^2$ or more. The laser rotated while moving from the inside outward in the region in which the via 20 was formed as illustrated with the arrow of FIG. 2A when the laser was viewed in the thickness direction. As illustrated in FIG. 3, the inner peripheral surface 25 had a tapered shape when the cross section was macroscopically viewed.

As illustrated in FIG. 4C, next, the additional conductive layer 32 was formed on the one-side surface in the thickness direction of the laminate 6, and the conductive portion 5 was formed on the inner peripheral surface 25 of the via 20. Copper plating was carried out in this step. The additional conductive layer 32 had a thickness of 6 μm. Consequently, the first conductive layer 3 had a thickness of 24 μm.

In this manner, as illustrated in FIG. 1, the wiring circuit board 1 including the insulating layer 2, the first conductive layer 3, the second conductive layer 4, and the conductive portion 5 was produced.

Example 2 and Comparative Examples 2 and 3

The same process as Example 1 was carried out, thereby producing a wiring circuit board 1. However, the conditions for the first irradiation step were changed according to Table 1.

Comparative Example 1

The same process as Example 1 was carried out, thereby producing a wiring circuit board 1. However, the insulating layer 2 included only a dense polyimide sheet. Further, as illustrated in FIG. 2B, the laser rotated while moving from the outside inward in the region in which the via 20 was formed as illustrated with the arrow of FIG. 2A when the laser was viewed in the thickness direction.

<Measurement>

Of each of Examples 1 and 2 and Comparative Examples 1 to 3, an SEM picture of the cross section of the inner peripheral surface 25 of the wiring circuit board 1 was taken and a processed image thereof was obtained. Then, the above-described length L was measured. The results are shown in Table 1. Further, the processed image of the SEM picture of the cross section of Example 1 is shown in FIG. 7.

<Evaluations of Connection Reliability of Conductive Portion 5>

Thermal shock testing was carried out to evaluate the connection reliability of the conductive portion 5 of the wiring circuit board 1 of each of Examples 1 and 2 and Comparative Examples 1 to 3. In the thermal shock testing, the wiring circuit board 1 was alternately immersed in two liquid tanks. The temperature of one of the liquid tanks was −65° C. The temperature of the other tank was 150° C. The wiring circuit board 1 was immersed in each tank for five minutes. A cycle in which the wiring circuit board 1 was immersed in the two liquid tanks 2 one by one was carried out 1000 times.

Thereafter, the SEM picture of the cross section of each of the ten conductive portions 5 was observed. By the following criteria, the connection reliability of each of the conductive portions 5 was evaluated. The results are shown in Table 1.

Good: Neither of a crack nor a void was confirmed in the ten conductive portions 5.

Fair: One crack or one void was confirmed.

Bad: Some cracks and voids were confirmed and the total was two or more.

| | Example 1 | Example 2 | Comparative Example 1 | Comparative Example 2 | Comparative Example 3 |
|---|---|---|---|---|---|
| Length L (μm) | 5.5 | 3.4 | 0.5 | 15 | 12 |
| Presence or absence of Porous insulating layer | Presence | Presence | Absence | Presence | Presence |
| Shape of inner peripheral surface (Macroscopic observation) | Tapered | Outward expansion of intermediate portion in thickness direction | Tapered | Outward expansion of intermediate portion in thickness direction | Tapered |
| Direction of laser rotation | From inside to outside | From outside to inside | From outside to inside | From inside to outside | From inside to outside |
| Laser energy density in first irradiation process | 17.2 | 17.2 | 17.2 | 27.1 | 22.6 |
| Evaluations of reliability of conductive portion | Good | Fair | Bad | Bad | Bad |

While the illustrative embodiments of the present invention are provided in the above description, such is for illustrative purpose only and it is not to be construed as limiting in any manner. Modification and variation of the present invention that will be obvious to those skilled in the art is to be covered by the following claims.

DESCRIPTION OF REFERENCE NUMERALS 1 wiring circuit board
2 insulating layer
3 first conductive layer
4 second conductive layer
5 conductive portion
20 via
22 porous insulating layer
25 inner peripheral surface
27 one-side surface
28 other-side surface
31 underlying conductive layer
32 additional conductive layer
C1 first connection point
C2 second connection point
P outermost position
S segment

The invention claimed is:

1. A wiring circuit board comprising:
an insulating layer having a via penetrating in a thickness direction;
a first conductive layer disposed on a one-side surface in the thickness direction of the insulating layer;
a second conductive layer disposed on the other-side surface in the thickness direction of the insulating layer; and
a conductive portion disposed on an inner peripheral surface of the via and electrically connecting the first conductive layer and the second conductive layer,
wherein a length (L) that is measured as follows is 1 μm or more and 10 μm or less;
wherein the length (L) is obtained by drawing a segment (S) joining a first connection point (C1) and a second connection point (C2) in a cross-sectional view of the wiring circuit board;
wherein the first connection point (C1) is a point at which the one-side surface in the thickness direction of the insulating layer and the inner peripheral surface are connected;
wherein the second connection point (C2) is a point at which the other-side surface in the thickness direction of the insulating layer and the inner peripheral surface are connected;
wherein an outermost position (P) that is farthest outward from the segment (S) on the inner peripheral surface in the cross-sectional view is identified; and
wherein the length (L) as the shortest distance from the segment (S) to the outermost position (P) is measured.

2. The wiring circuit board according to claim 1, wherein the insulating layer includes a porous insulating layer.

3. The wiring circuit board according to claim 1, wherein the inner peripheral surface has a tapered shape when a cross section of the inner peripheral surface is macroscopically viewed.

4. A method of producing a wiring circuit board, the method being a method of producing the wiring circuit board according to claim 1, the method comprising:
a step of preparing a laminate including a second conductive layer, an insulating layer, and an underlying conductive layer;
a step of irradiating the laminate with a laser from one side in the thickness direction to form a via in the underlying conductive layer and the insulating layer; and
a step of forming an additional conductive layer on the one-side surface of the laminate and forming a conductive portion on an inner peripheral surface of the via,
wherein the step of forming the via includes a step of applying the laser with an energy density of 1 J/cm$^2$ or more and 20 J/cm$^2$ or less.

5. The method according to claim 4, wherein, in the step of forming the via, the laser rotates while moving from inside outward in a region in which the via is formed.

6. The method according to claim 4, wherein, in the step of preparing the laminate, the insulating layer includes an adhesive insulating layer and a porous insulating layer in this order in the thickness direction.

* * * * *